United States Patent [19]

Horne et al.

[11] Patent Number: 4,902,572
[45] Date of Patent: Feb. 20, 1990

[54] FILM DEPOSITION SYSTEM

[75] Inventors: William E. Horne; Arthur C. Day, both of Renton, Wash.

[73] Assignee: The Boeing Company, Seattle, Wash.

[21] Appl. No.: 183,132

[22] Filed: Apr. 19, 1988

[51] Int. Cl.[4] ........................ B05D 3/06; B32B 15/00
[52] U.S. Cl. ..................................... 428/409; 427/38; 118/620; 118/621; 118/726
[58] Field of Search .................. 427/38; 428/409, 446, 428/689, 702, 913, 918; 118/726, 620, 621

[56] References Cited

U.S. PATENT DOCUMENTS

| | | |
|---|---|---|
| 3,566,829 | 3/1971 | Hill .................................. 118/5 |
| 3,583,361 | 6/1971 | Laudel, Jr. ..................... 118/49.5 |
| 3,974,059 | 8/1976 | Murayama ....................... 204/298 |
| 4,082,636 | 4/1978 | Takagi ............................. 204/192 |
| 4,197,814 | 4/1980 | Takagi et al. ................... 118/726 |
| 4,217,855 | 8/1980 | Takagi ............................. 118/719 |
| 4,286,545 | 9/1981 | Takagi et al. ................... 118/723 |
| 4,342,631 | 8/1982 | White et al. ..................... 204/192 |
| 4,451,499 | 5/1984 | Morimoto et al. ................ 427/38 |
| 4,559,096 | 12/1985 | Friedman et al. ............... 427/38 |
| 4,559,901 | 12/1985 | Morimoto et al. ................ 427/38 |
| 4,676,194 | 6/1987 | Satou et al. ................... 118/621 |
| 4,685,976 | 8/1987 | Schachameyer et al. ......... 427/38 |
| 4,686,022 | 8/1987 | Rempt .............................. 204/157 |
| 4,724,106 | 2/1988 | Morimoto et al. ................ 427/38 |
| 4,740,267 | 4/1988 | Knauer et al. ................... 427/38 |

OTHER PUBLICATIONS

T. Takagi et al., "New Developments in Ionized-Cluster Beam and Reactive Ionized-Cluster Beam Deposition Techniques," Thin Solid Films, 63, pp. 41–51, 1979.
Hagena et al., "Formation and Detection of High-Energy Cluster Beam," Rarefied Gas Dynamics, vol. 51, Part II, Progress in Astronautics and Aeronautics, Technical paper selected from the 10th International Symposium on Rarefied Gas Dynamics, Jul. 1976.

*Primary Examiner*—Stanley Silverman
*Attorney, Agent, or Firm*—Finnegan, Henderson, Farabow, Garrett & Dunner

[57] ABSTRACT

A film deposition system is provided for depositing a film of at least first and second materials onto a common target. This system includes a housing within which the common target is located and within which a high vacuum region may be formed. The system further includes first and second crucibles each containing respective first and second materials to be deposited; a heating element and/or cooling element for vaporizing the materials in each of the first and second crucibles, respectively; first and second nozzles for ejecting the vaporized material from the first and second crucibles into the high vacuum region to form non-ionized atomic clusters by adiabatic expansion with those clusters traveling in first and second directions, respectively, each of which are non-coincident with the common target; first and second electron strippers for converting a portion of those non-ionized clusters to ionize clusters of the first and second materials; first and second accelerators for accelerating the ionized clusters of the first and second materials; and first and second deflectors for deflecting the ionized clusters of first and second materials to third and fourth directions, respectively, each of which are coincident with the common target. By varying the percentage of non-ionized atomic clusters converted to ionized clusters, the rate of flow of the ionized clusters deposited upon the common material may be effectively instantaneously controlled to thereby deposit a film having a continuous and smoothly varying property.

47 Claims, 4 Drawing Sheets

FILM DEPOSITION SYSTEM

BACKGROUND OF THE INVENTION

I. Field of the Invention

The present invention relates to a method and apparatus for controllably depositing a thin film of material on a substrate and to the thin film products.

II. Background Information

Systems are known for depositing thin films of material on a substrate. One such system comprises a housing in which a high vacuum region may be formed; a crucible containing the material to be deposited; a heater for vaporizing that material in the crucible; a nozzle for ejecting the vaporized material from the crucible through the nozzle into the high vacuum region to form non-ionized atomic clusters of the material by resultant adiabatic expansion which are held together by van der Waals forces and which drift outward from the nozzle on an approximate line of sight basis; an electrode system for converting a percentage of the non-ionized clusters into ionized clusters; and an accelerator for accelerating the ionized clusters toward the target upon which the thin film is to be deposited.

Such a system, as is for example disclosed in U.S. Pat. No. 4,217,855 issued to Takaqi, provides for control of deposition rate primarily through control of vapor pressure within the crucible. In addition, the ion acceleration voltage is critical in obtaining the maximum deposition rate. Crucible temperature, the shape of the ejection nozzle, the deposition material employed, and the substrate material employed are also important in determining deposition rate.

Prior art systems of the Takaqi type recognize the possibility of reversing the polarity on the accelerator to impede the progress of the ionized clusters without affecting the progress of the non-ionized clusters in their movement toward the target. At least one system, that disclosed in U.S. Pat. No. 4,082,636 issued to Takaqi, contemplates an acceleration voltage which causes the ionized clusters to actually be repelled and thereby prohibits deposition of the ionized clusters on the target, at least during a portion of the operating time of the system.

An object of the present invention is to provide an alternative and improved method for controlling the rate of deposition of material forming a thin film on a target.

One prior art system disclosed in U.S. Pat. No. 4,197,814 issued to Takeqi et al. contemplates the deposition of two or more materials on a target. This system discloses the employment of two crucibles each having a separate heating mechanism for vaporizing a different material in each crucible. The nozzles on these two crucibles are disclosed as being directed toward a common target, thereby permitting both ionized and non-ionized atomic clusters from each crucible to be simultaneously deposited on that target. With such a system, the temperatures of the crucibles may be independently regulated so as to regulate the pressures of the vapors contained in those crucibles to thereby independently control the deposition rates of the two materials. However, any such change in the crucible temperature takes a considerable amount of time in comparison to the total deposition time typically required and thereby renders instantaneous control of the deposition rates effectively impossible.

It is also known that systems of the type referred to above are capable of depositing an oxide of a material in a crucible, through the introduction of oxygen gas into the high vacuum region adjacent the target. However, it is difficult to control the rate and degree of oxidation using this methodology.

In operating these prior art systems a layer of the film of a particular composition is deposited, the deposition process is stopped, the crucible temperature or pressure within the high vacuum region is altered, and thereafter the deposition process begun again to deposit a new composition. As a consequence, rather than being smoothly varying, a material having a series of discrete, discontinuous step changes in composition is obtained.

Optical filters or antireflection coatings typically include these discrete stacked layers of dielectric material, each layer having different optical properties. New applications for these filters indicate the need to develop systems having the capacity to deposit thin film layers which have substantially smoothly or continuously varying material properties as a function of film thickness, rather than a series of discrete step-wise changes. The prior art systems are incapable of providing smoothly varying material properties because the vaporization rate (and consequently the deposition rate) responds to changes in crucible temperature too slowly.

It is also an object of the present invention to provide a system which permits a thin layer to be deposited which has smoothly or continuously varying material properties as a function of thickness of that layer, such as a film that has a continuously graded index of refraction caused by the continuously changing composition of the layer.

Additional objects and advantages of the invention will be set forth in the description which follows, and in part will be obvious from that description or may be learned by practice of the invention.

SUMMARY OF THE INVENTION

To achieve the foregoing objectives, and in accordance with the purposes of the invention as embodied and broadly described herein, a film deposition system for depositing a film of material onto a target is provided which comprises: a housing within which the target or substrate is located and within which a high vacuum region (low pressure region) may be formed; at least one crucible containing material to be deposited on the target; an evaporator for vaporizing the material in the crucible; a nozzle for ejecting vaporized material from the crucible therethrough into the high vacuum region to form non-ionized atomic clusters by resultant adiabatic expansion, the clusters traveling in a first direction through the high vacuum region, non-coincident with said target; a stripper or an ionizer for ionizing a percentage of the non-ionized clusters into ionized clusters; an accelerator for accelerating the ionized clusters; and a deflector for deflecting the ionized clusters in a second direction coincident with the target to result in a flow of non-ionized clusters along the first direction which are not deposited on the target and a flow of ionized clusters along the second direction which are deposited as a film on the target.

Preferably, the system of the present invention also includes a controller for selectively varying the percentage of clusters which are ionized by the ionizer. The ionizer includes an anode and a cathode for causing ionization through electron impact and the controller includes a grid interposed between the anode and cathode for accelerating the electrons through the neutral or non-ionized cluster beam.

In an alternative embodiment a film deposition system for depositing a film of at least first and second materials onto a common target is provided which comprises: a housing within which the common target is located and within which a high vacuum region may be formed; at least first and second crucibles, each crucible containing (i) a material to be deposited; (ii) an evaporator for vaporizing materials in the crucible; (iii) a nozzle for ejecting vaporized material from the crucible therethrough into the high vacuum region to form non-ionized clusters of the material by resultant adiabatic expansion traveling in a first predetermined direction which is non-coincident with the target; (iv) an ionizer for independently converting a percentage of the non-ionized clusters into respective ionized clusters; (v) an accelerator for accelerating the ionized clusters of the material; and (vi) a deflector for deflecting the ionized clusters into a path which is coincident with the target and resulting in a flow of non-ionized clusters along the first direction non-coincident with the target.

Preferably, the evaporator of one crucible is divided into two chambers, one of which includes a cooling element so that the crucible is a "cryocrucible." Such a crucible usually contains oxygen or nitrogen as the material to be deposited, the choice being dependent on whether oxide or nitride films are being formed. This cryocrucible generally includes a first chamber opening to the high vacuum region through the nozzle, a second chamber for housing the deposition material as a liquid, and a solenoid-actuated valve connecting the chambers. Vapor may be selectively loaded from the second chamber into the first chamber for emission through the nozzle.

As with the other embodiment each ionizer includes a controller for independently selectively varying the percentage of the non-ionized clusters of the material which are ionized with the associated ionizer. Each ionizer similarly includes an anode and a cathode for causing ionization through electron impact, and the controller includes a grid interposed between the respective anode and cathode for accelerating the electrons through the neutral cluster beam.

Preferably, the deflector is interposed between the ionizer and the accelerator to deflect ionized clusters before accelerating them to the target. The accelerator may be interposed between the ionizer and the deflector in which case deflection would occur on accelerated, ionized clusters.

DESCRIPTION OF THE PREFERRED EMBODIMENT

Reference will now be made in detail to the presently preferred embodiment of the invention as illustrated in the accompanying drawings.

Figure 1:
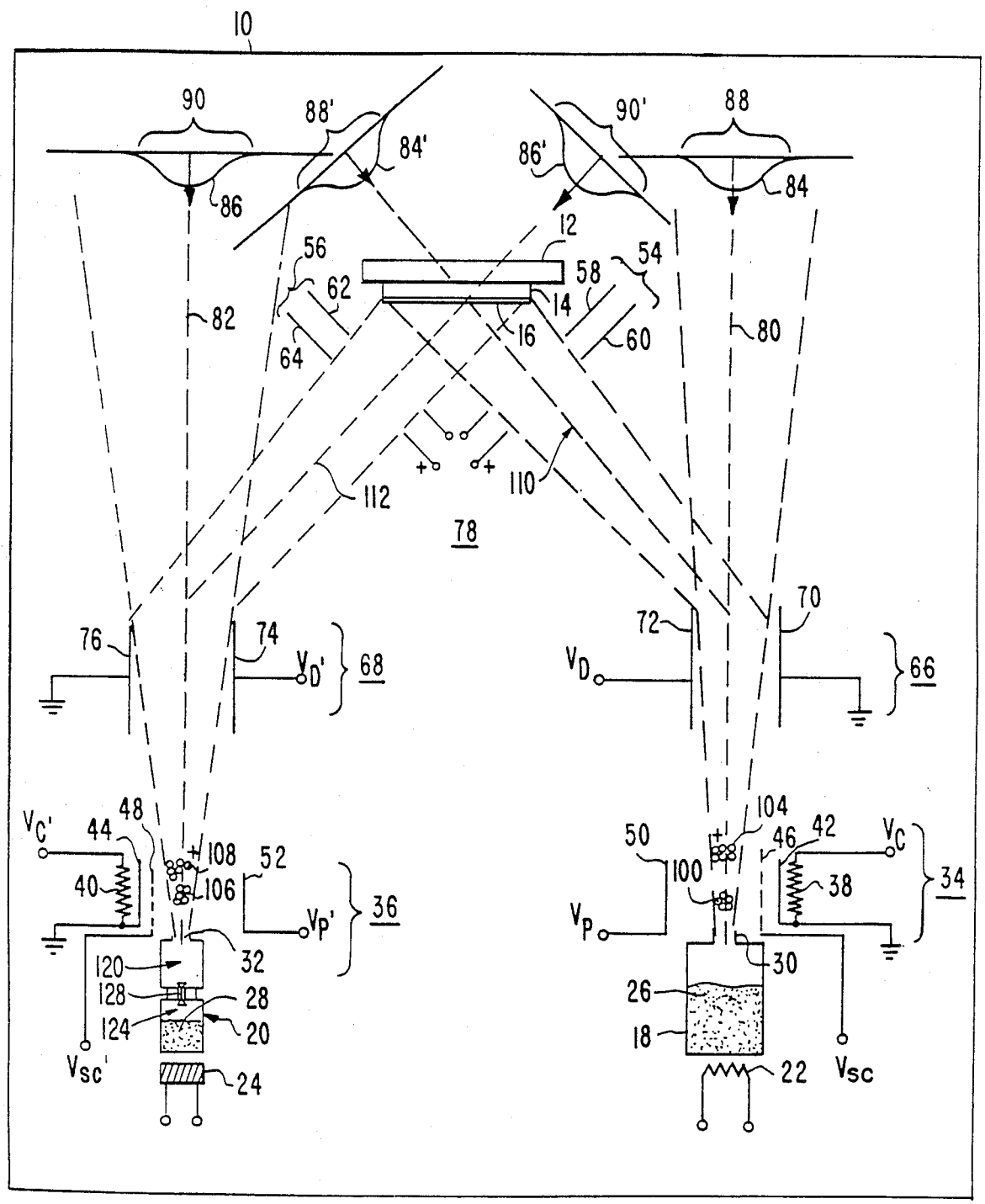
FIG. 1 is a schematic illustration of a film deposition system of the present invention.

FIG. 1 is a schematic illustration of a deposition system comprising a housing 10, a target holder 12, a target or substrate 14 upon which a film 16 is to be deposited, crucibles 18 and 20, a heating element 22, a cooling element 24, materials 26 and 28, nozzles 30 and 32, electron impact ionization stages 34 and 36 comprising cathodes 38 and 40, shield grids 42 and 44, screen grids 46 and 48, and anodes 50 and 52, accelerators 54 and 56 comprising accelerator plates 58, 60, 62 and 64, and deflectors 66 and 68 comprising deflector plates 70, 72, 74 and 76. Nozzles 30 and 32 preferably can be of the Joule-Thomson type.

Housing 10 provides a vessel within which target holder 12 and target 14 are located and within which a high vacuum region 78 may be formed. As should be well understood by those skilled in the art, a high vacuum region 78 typically has a pressure less than $10^{-4}$ Torr. In addition to target holder 12 and target 14, the remaining elements of the system of FIG. 1 are all illustrated as being enclosed within housing 10. As should be apparent to those skilled in the art, placing every element within housing 10 is nonessential. For example, at least a portion of vessels 18 and 20 and/or at least a portion of heating element 22 and cooling element 24 may, of course, be located outside of housing 10. What is important, however, is that clusters of atoms produced from nozzles 30 and 32 have access to a clear path within high vacuum region 78 from nozzles 30 and 32 to target 14.

Target 14 may comprise any form of material on which film 16 is to be deposited. Target 14 may, for example, comprise a silicon wafer substrate, glass, a metal foil, or a thin film semiconductor, as will be known to those skilled in the art.

Crucibles 18 and 20 of FIG. 1 provide vessels for holding respective materials 26 and 28 which are to be deposited on target 14 to form at least a portion of film 16. As should be well understood by those skilled in the art, heating element 22 (such as a resistive heater) associated with crucible 18 operates to vaporize material 26 within crucible 18. As a consequence, sufficient differential pressure between the vaporized material within crucible 18 and the pressure of high vacuum region 78 (a differential typically of two to four orders of magnitude) is obtained to permit adiabatic expansion of vaporized material 26 from crucible 18 through nozzle 30 into high vacuum region 78 in a manner which forms non-ionized atomic clusters of material 18, preferably on the order of 500 to 1,000 atoms per cluster. As is presently understood, the resultant non-ionized atomic clusters are held together by the attraction of van der Waals forces.

Although crucible 20 may be operated with a corresponding heating element in the same manner as crucible 18 and heating element 22, in accordance with an alternative embodiment of the present invention, crucible 20 may include a cooling element 24 in a manner which will be described in more detail below. In either event material 28 within crucible 20 is likewise expanded through corresponding nozzle 32 of crucible 20 into high vacuum region 78 to form non-ionized atomic clusters by resultant adiabatic expansion. The cooling element 24 retains a volatile material, such as oxygen or nitrogen, in the liquid state and influx of heat from the environment is satisfactory to produce the necessary evaporation.

The non-ionized atomic clusters of materials 26 and 28 exiting nozzles 30 and 32 travel in respective first and second directions 80 and 82 on an approximate line of sight basis, within a distribution which extends transverse to directions 80 and 82 in a manner depending upon the particular shape of nozzles 30 and 32. For example, with a nozzle having an aspect ratio of one, the distributions along directions 80 and 82 may be approximated by cosine functions 84 and 86, respectively. As the aspect ratio is increased, more directionality and a narrower distribution is achieved; the size of the effective target areas 88 and 90 is reduced. Accordingly, the term first and second direction as used herein refers to the approximate line of sight direction of the non-ionized atomic particles issuing from the nozzle of a crucible and formed as a result of adiabatic expansion and encompasses the distribution that actually results.

In the prior art systems, first direction 80 and second direction 82 are directed to intersect target 14. However, in accordance with the teachings of the present invention, first direction 80 and second direction 82 are aligned to be noncoincident with target 14. Accordingly, clusters emitted from vessels 18 and 20, unless deflected, travel along directions 80 and 82, respectively, without being deposited on target 14 as a portion of film 16. A system having at least one crucible directed at the target and at least one crucible of the type described above is also possible.

Electron strippers 34 and 36 operate by electron impact to ionize or convert a selected portion of the non-ionized clusters emitted from the nozzles into ionized clusters. As may be seen in more detail in FIG. 2, electron stripper 34 comprises a wire filament cathode 38, a shield grid 42, a screen grid 46 and a plate anode 50. Wire filament cathode 38 is connected at one end to ground and at the other end to a cathode voltage $V_c$. Plate anode 50 is coupled to a plate or anode voltage $V_p$ which is positive with respect to cathode voltage $V_c$. Screen grid 46 is interposed between wire filaments cathode 38 and plate anode 50 and is coupled to receive a screen grid voltage $V_{sg}$ which may be selectively variable. Screen grid 46 is positioned to permit passage of non-ionized clusters 100 emitted from nozzle 30 between screen grid 46 and anode 50. Shield grid 42 is interposed between cathode 38 add screen grid 46 and shield grid 42 is coupled to ground.

In operation, cathode 38, which preferably comprises a tungsten wire filament, is heated through application of cathode voltage $V_c$ to emit an electron beam 102 in the direction of anode 50 which preferably comprises a tungsten foil or plate. Shield grid 42 operates to shape electron beam 102 as should be well known to those skilled in the art. Screen grid 46 operates to control the degree and magnitude of electrons accelerated toward plate 50 in response to the value of screen grid voltage $V_{sg}$. Thus, as non-ionized clusters 100 pass through electron beam 102, a percentage of non-ionized clusters 100 are stripped of electrons by operation of beam 102 and are thereby converted to ionized clusters 104. Since ionized clusters 104 pass through the relatively field-free region between screen grid 46 and anode 50, ionized clusters 104 continue to travel in a line of sight basis along first direction 80.

By varying the screen voltage $V_{sg}$, the intensity of the electron beam 102 is varied and, hence, the percentage of non-ionized clusters 100 converted to ionized clusters 104 may be accurately and quickly controlled. The percentage portion of the beam ionized is substantially linearly related to the screen voltage. Control of the ionization can therefore be affected by the type of voltage waveform selected and applied to the grid. A sinusoid, triangular, sawtooth or other voltage signal can be applied to the grid, and in each case will control the percentage ionization of the beam in accordance with the particular signal applied.

Furthermore the sensitivity of the linear control is much improved over the prior art. Variations in screen voltage $V_{sg}$ may occur on the order of each $10^{-3}$ to $10^{-6}$ seconds which, for practical purposes in comparison to typical deposition time of minutes or hours, is effectively instantaneous. At a typical deposition rate of 10 Å/sec, $10^{-3}$ sec corresponds to 0.1 Å thickness, which is much less than a monolayer. Thus, much better control is achieved than with standard methods where changes occur over several seconds only giving control over about a 30 Å layer at best. An effectively continuous control of the percentage of non-ionized clusters 100 converted to ionized clusters 104 may be obtained through operation of screen grid 46. As a result a superior product can be made having physical characteristics more accurately controlled. An optical filter having a continuously variable index of refraction can be made by the method of this invention.

Figure 2:
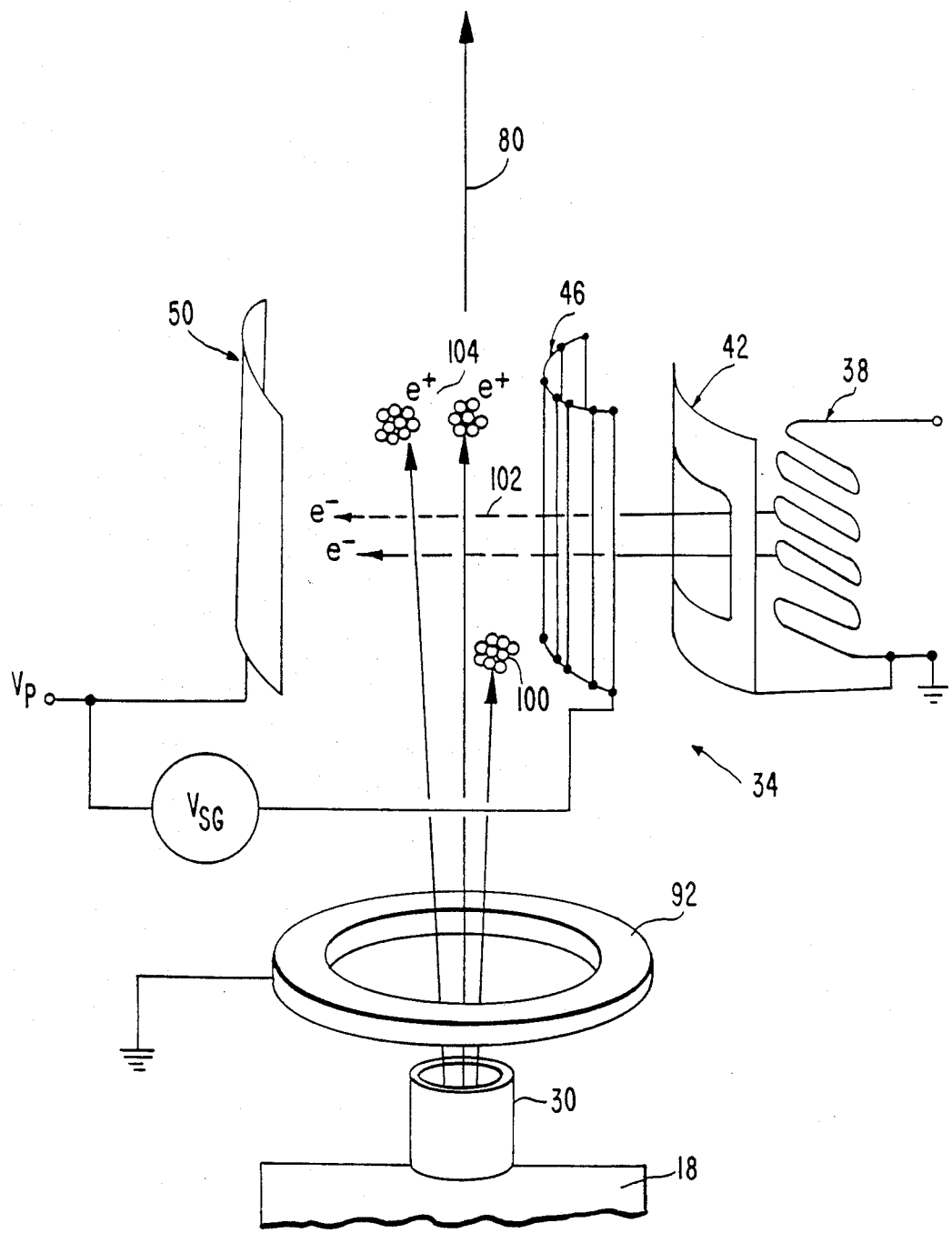
FIG. 2 is an illustration of an electron stripper or electron impact ionization stage used in the system illustrated in FIG. 1.

A ring 92 is illustrated in FIG. 2 interposed between nozzle 30 and electron stripper 34. Ring 92 is shown electrically coupled to ground and operates as an electrical shield between nozzle 30 and vessel 18 on the one hand and electron stripper 34 on the other hand.

Electron stripper 36 associated with crucible 20 of FIG. 1 operates and may be constructed in precisely the same manner as electron stripper 34 described above in connection with FIG. 2, to convert a percentage of non-ionized clusters 106 of material 28 to ionized clusters 108 of material 28 which, upon exit from electron stripper 36, are traveling on a substantially line of sight basis along second direction 82.

In accordance with the teachings of the present invention, a mechanism is provided for deflecting ionized clusters from a first direction non-coincident with a target to another direction coincident with that target to split the cluster beam and to establish a flow of non-ionized clusters along the first direction and a flow of ionized clusters along the coincident path.

As shown in FIG. 1, deflection plates 70 and 72 of deflector 66 are aligned on either side of the beam of non-ionized clusters 100 and ionized clusters 104. Plates 70 and 72 are energized with a deflection voltage $V_D$ of sufficient magnitude to deflect ionized clusters 104 from continuing travel along first direction 80 to a third direction 110 coincident with target 16 to thereby permit deposition of ionized clusters 104 on target 16. However, since non-ionized clusters 100 are not affected by deflector 66, non-ionized clusters 100 continue to travel along first direction 80 and are not deposited on target 16.

Deflector 68 with deflector plates 74 and 76 operate using a deflection voltage $V_D$ in a similar manner as deflector 66 and deflector plates 70 and 72 to deflect ionized clusters 108 traveling along second direction 82 to a fourth direction 112 which is also coincident with target 16. Thus, ionized clusters 108 are deposited on film 16 while non-ionized clusters 106, whose direction of travel is not affected by deflector 68, continue along second direction 82 and are not deposited on target 16.

Ionized clusters 104, upon travel along third direction 110, continue to have a distribution 84' and a target area 88' which may be substantially identical in form to the distribution 84 and target area 88 for non-ionized clusters 100. The distribution and area, however, may be altered by focusing the beam. Target area 88' is preferably selected to cover target 14 and thereby deposit film 16 over the entire surface of target 14. In the alternative, target 88' might be selected to be smaller than target 14 to deposit material 26 only on selected locations of target 14. The deflection voltage $V_D$ may also be modulated to deposit material 26 on target 14 at selected times.

Similarly, ionized clusters 108 from electron stripper 36 travel along fourth direction 112 after deflection by deflector 68 with a distribution 86' and a target area 90'. Like target area 88', target area 90' may be controlled to deposit material 28 in selected locations at selected times.

The temperature for deposition varies with the choice of materials and can be as high as about 1400° C. for silver. Typical temperatures are less than 1000° C. The temperature must be high enough to allow vaporized material to exist at the reduced pressure of the high vacuum region 78, which is typically less than $10^{-4}$ Torr.

Most semiconductor materials can be deposited using the system of this invention. In particular, II-VI and III-V semiconductor materials such as ZnSe, GaAs (and $Al_xGa_{1-x}As$), and CdTe can be deposited. Using the cryocrucible, which is discussed in more detail below, such compounds as SiO, silicon nitride ($Si_3N_4$), SiO/silicon nitride, and ZnO can be deposited.

Figure 3:
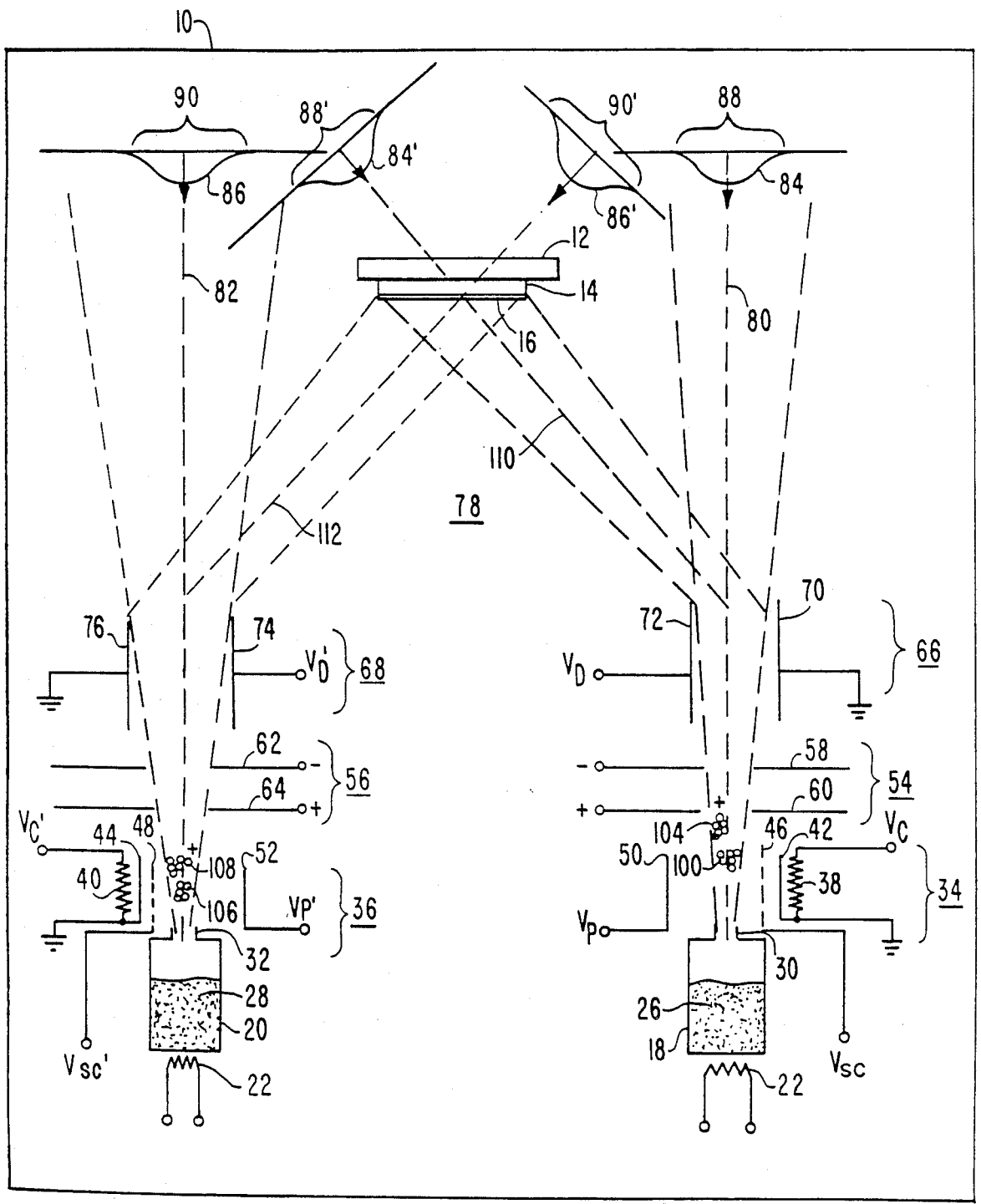
FIG. 3 is a schematic illustration of an alternative embodiment of the present invention.

Accelerators 54 and 56 provide a mechanism for accelerating ionized clusters 104 and 108, respectively along directions 110 and 112, as is shown in FIG. 1. Accelerators 54 and 56 may comprise oppositely charged plates 58, 60 and 62, 64 having a voltage potential applied across them typically in the range of 0-10KV. Accelerators 54 and 56 preferably are located interposed between target 14 and deflectors 66-68 as illustrated in FIG. 1 to permit non-accelerated ionized clusters 104 and 108 to be deflected by deflectors 66 and 68. As shown in FIG. 3, accelerators 54 and 56 might be located between deflectors 66, 68 and electron strippers 34 and 36. With this arrangement, however, deflectors 66 and 68 must deflect accelerated ionized clusters 104 and 108. As a consequence, the deflection voltages $V_D$ and $V_{D'}$ for the FIG. 3 arrangement must necessarily be greater than the deflection voltages $V_D$ and $V_{D'}$ for the FIG. 1 arrangement, since ionized clusters having greater kinetic energy pass through the deflector faster than ionized clusters having less kinetic energy.

It should also be understood that plates 58 and 62 in FIG. 1 may, in the alternative, be located behind target 14, may actually comprise a portion of target holder 12, or may actually comprise a portion of target 14 itself.

With either the FIG. 1 or FIG. 3 arrangement, since only ionized clusters 104 and 108 are deposited on target 14 to form film 16, and since the percentage of non-ionized clusters 100 and 106 converted to ionized clusters 104 and 108 by electron strippers 34 and 36, respectively, is each independently controllable by respective screen control voltages $V_{sg}$ and $V_{sg'}$, the rate of deposition of material 26 and material 28 on target 14 may be independently and essentially instantaneously controlled. In effect, with other factors being constant, the deposition rate of material 26 on target 16 will be substantially a linear function of stripping voltage $V_{sg}$ and the deposition rate of material 28 on target 16 will be substantially a linear function of stripping voltage $V_{sc'}$. Since voltages $V_{sc}$ and $V_{sc'}$ can be nearly instantaneously altered (altered in $10^{-3}$ to $10^{-6}$ seconds), the rate of deposition of materials 26 and 28 may be effectively instantaneously altered, thereby permitting an application of materials 26 and 28 either alone or in combination on target 14 which varies instantaneously as a function of the thickness of film 16. Smoothly varying the stripper voltage can produce films having smoothly varying compositions as a function of film thickness. By continuously varying the voltage, a film can be prepared to have a continuously varying composition, and, for antireflection coatings made from SiO or ZnO, might have a continuously graded index of refraction because of the gradient in composition.

Of course, the deflector power and accelerator can be varied to control the deposition rate alone or in combination with the other elements. Control of these electrical elements provides greater sensitivity than simply controlling the crucible temperature as done conventionally in the prior art. In accordance with an alternative feature of the invention, either or both crucibles 18 and 20 may be operated in conjunction with a cooling element. Specifically, as illustrated in FIG. 1, crucible 20 may include a cooling element 24 which maintains the crucible at a sufficiently low temperature to result in a vapor pressure in the crucible of about 1-10 Torr. Typically a cryocrucible operates at a temperature of about 50°K and will emit material into a chamber 120 (FIG. 4) resulting in a pressure of about 1-10 Torr in chamber 120. Material 28 may be liquid oxygen. The cooling element 24 operates to cool the oxygen until its vapor pressure in chamber 120 is proper to permit cluster formation upon exit from nozzle 32. The cryocrucible deposition system has innumerable applications, including the capacity to make dielectric stack optical filters with a continuously variable index of refraction.

Figure 4:
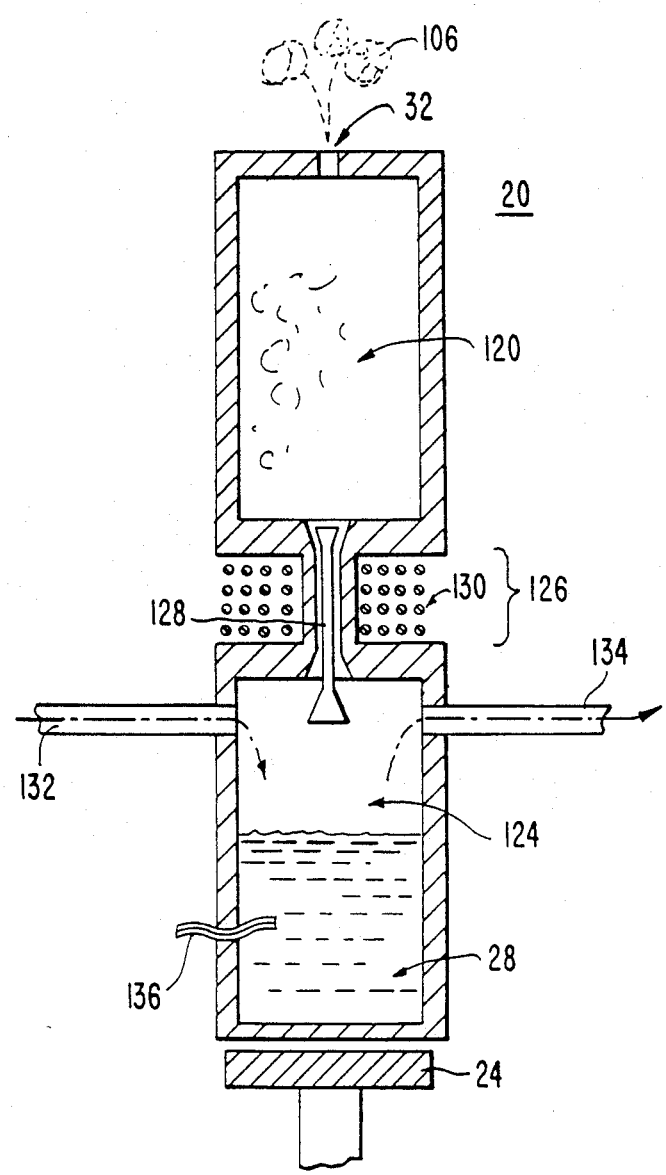
FIG. 4 is an illustration of a cryocrucible for use in the system of FIG. 3.

As best shown in FIG. 4, the cryocrucible comprises a first chamber 120, a second chamber 124, a solenoid actuated valve 126 comprising a valve stem 128 and a solenoid coil 130, an input port 132, an output vent 134, and a thermocouple 136. Material 28, preferably in the form of liquid oxygen or nitrogen, is introduced into second chamber 124 through input port 132. Cooling element 24, which preferably comprises a cold finger from a cryo-refrigerator, operates to cool material 28 to a desired temperature as measured by thermocouple 136 to lower the vapor pressure of material 28. The vaporized portion of material 28 is introduced to chamber 120 through the solenoid actuated valve 126 at a temperature and pressure which will produce clusters 106 of material 28 upon expansion through the nozzle into the housing. Vent 134 is provided to allow chamber 124 to be initially filled and is subsequently closed when the cryocrucible temperature is the correct temperature. When chamber 124 is initially filled from a liquid oxygen tank, film boiling will occur until the chamber wets and cools to about the temperature of the liquid oxygen. During the filling step, gaseous $O_2$ is vented out vent 134.

Although the cryocrucible concept referred to above has been disclosed in the environment of applying a film 16 to target 14, this concept has other applications as well. One of the most salient of these alternate applications is simulation of an atomic oxygen environment found in low earth orbit. Such simulation requires a directed beam of neutral oxygen atoms of approximately 5-6 eV kinetic energy.

The cryocrucible provided by crucible 20 and its related elements can deliver oxygen atoms ejected in non-ionized clusters 106 having about 500 to 1,000 atoms per cluster at thermal energy, namely, at low velocity. Electron stripper 36 ionizes one or a small number of atoms of selected clusters 106. The accelerating voltage applied to accelerator 56 may be adjusted to accelerate the partially ionized clusters to yield the appropriate kinetic energy. Thus, a source of low energy oxygen atoms loosely bound by van der Waals' forces can be prepared. The clusters have less than one percent ionization.

Additional advantages and modifications will readily occur to those skilled in the art. The invention in its broader aspects is, therefore, not limited to the specific detailed representative apparatus and illustrative examples shown and described. Accordingly, departure may be made from such details without departing from the spirit or scope of applicants' generic inventive concept. The claims should be interpreted broadly, and should be limited only as is necessary in view of the pertinent prior art.

We claim:

1. A film deposition system for depositing a film of material onto a target comprising:
    a housing within which the target is located and within which a high vacuum region may be formed;
    at least one crucible containing material to be deposited;
    means for vaporizing said material in said crucible;
    a nozzle for ejecting vaporized material from said crucible therethrough into said high vacuum region to form non-ionized atomic clusters by adiabatic expansion, the clusters traveling in a first direction through said high vacuum region, the direction being non-coincident with said target;
    means for converting a percentage of said non-ionized clusters into ionized clusters;
    means for accelerating said ionized clusters; and
    means for deflecting said ionized clusters in a second direction coincident with said target.

2. The system of claim 1 wherein said means for converting includes ionizing control means for selectively varying the percentage of non-ionized clusters which are ionized.

3. The system of claim 2 wherein said means for converting comprises an anode and a cathode and said ionizing control means comprises a grid interposed between said anode and said cathode.

4. The system of claim 3 further comprising voltage control means for varying the voltage applied to the grid.

5. The system of claim 4 wherein the voltage control means has a response time in the order of $10^{-3}$ to $10^{-6}$ seconds.

6. The system of claim 1 further comprising at least a second crucible containing a second material to be deposited, second means for vaporizing said second material in said second crucible, and a second nozzle for ejecting vaporized material from said second crucible therethrough into said high vacuum region, the second material traveling in clusters in the second direction through said high vacuum region toward said target.

7. The system of claim 1 wherein said means for deflecting is interposed between said means for converting and said means for accelerating.

8. The system of claim 1 wherein said means for accelerating is interposed between said means for converting and said means for deflecting.

9. A film deposition system for depositing a film of material onto a target comprising:
    a housing within which the target is located and within which a high vacuum region may be formed;
    a crucible containing material to be deposited;
    a cooling element for vaporizing said material in said crucible;
    a nozzle for ejecting vaporized material from said crucible therethrough into said high vacuum region to form non-ionized clusters by adiabatic expansion, the clusters traveling in a first direction through said high vacuum region, the direction being non-coincident with said target;
    an electron stripper having an anode and a cathode to inject electrons into said non-ionized clusters to ionize a percentage of said non-ionized clusters into ionized clusters;
    accelerator plates for establishing an electric field to accelerate said ionized clusters; and
    deflecting plates for establishing an electric field to deflect said ionized clusters in a second direction coincident with said target.

10. A film deposition system for depositing a film of first and second materials onto a common target comprising:
    a housing within which said common target is located and within which a high vacuum region may be found;
    first and second crucibles each containing respective first and second materials to be deposited;
    first and second nozzles for ejecting vaporized material from said first and second crucibles respectively therethrough into said high vacuum region to form non-ionized clusters by adiabatic expansion, the clusters traveling in first and second directions respectively through said high vacuum region, each of the directions being non-coincident with said common target;
    first and second means for independently converting a portion of said non-ionized clusters of said first and second materials into respective ionized clusters of said first and second materials;
    first and second means for accelerating said ionized clusters of said first and second materials; and
    first and second means for deflecting said ionized clusters of said first and second materials in a third and fourth direction, respectively, both of which third and fourth directions are coincident with said common target, to result in a flow of non-ionized clusters of said first material along said first direction which are not deposited on said common target, a flow of non-ionized clusters of said second material along said second direction which are not deposited on said common target, a flow of ionized clusters of said first material along said third direction which are deposited as a portion of said film on said common target and a flow of ionized clusters of said second material along said fourth direction which are deposited as a portion of said film on said common target.

11. The system of claim 10 further comprising a cooling element for cooling the second material in the second crucible.

12. The system of claim 11 wherein the second material is oxygen.

13. The system of claim 11 wherein the second material is nitrogen.

14. The system of claim 11 wherein said second crucible comprises a first chamber in fluid communication with said high vacuum region through said second nozzle, a second chamber for housing the second material, and a valve connecting said first and second chambers so that vapor of said second material may be selectively loaded from said second chamber into said first chamber through said valve.

15. The system of claim 10 wherein said first and second means for converting include first and second means for independently selectively varying the percentage of said non-ionized clusters of said first and second materials which are respectively ionized.

16. The system of claim 14 wherein said first and second means for converting includes first and second means for independently selectively varying the percentage of said non-ionized clusters of said first and second materials which are respectively ionized.

17. The system of claim 15 wherein said first and second means for converting each include an anode and a cathode and wherein said first and second means for selectively varying each include a grid interposed between said respective anodes and cathodes.

18. The system of claim 16 wherein said first and second means for converting each include an anode and a cathode and wherein said first and second means for selectively varying each include a grid interposed between said respective anodes and cathodes.

19. The system of claim 11 further comprising means for vaporizing the first material, the vaporizing means being associated with the first crucible.

20. The system of claim 19 wherein the vaporizing means includes a resistive heater element.

21. A method of generating a partially ionized atomic oxygen beam including the steps of:
placing oxygen in a crucible;
cooling the oxygen until its vapor pressure is reduced to a level permitting formation of atomic clusters of said oxygen upon adiabatic expansion into a high vacuum region;
expanding said oxygen through an exit nozzle of said crucible into a high vacuum region to form atomic clusters;
ionizing a selected percentage of said atomic clusters; and
accelerating said ionized clusters to a predetermined kinetic energy.

22. The method of claim 21 wherein in the ionizing step less than about one percent of the oxygen atoms in any cluster are ionized.

23. A method for depositing a film of material onto a target comprising the steps of:
placing the material to be deposited in a crucible;
vaporizing said material in said crucible;
ejecting the vaporized material through a nozzle of said crucible into a high vacuum region to expand the material adiabatically and to form non-ionized atomic clusters traveling in a first direction noncoincident with the target;
converting a selected percentage of said non-ionized clusters into ionized clusters;
deflecting said ionized clusters to travel in a second direction coincident with said target; and
accelerating said ionized clusters traveling in said second direction.

24. The method of claim 23 wherein the step of converting includes selectively varying the percentage of non-ionized clusters which are ionized.

25. A deposited material having a substantially continuously varied composition of at least two compounds, the material being the product of the process of:
depositing ion clusters of a first compound on a substrate;
simultaneously depositing ion clusters of a second compound on the substrate, the first and second compounds comprising at least a portion of the material; and
varying the deposition rate of the second compound relative to the first compound substantially continuously during the deposition of the ion clusters of the first and second compounds so that the material has a substantially continuously varied composition.

26. The material of claim 25 wherein the process step of varying the deposition rate includes the substeps of:
creating a cluster beam of the second compound at a predetermined rate;
ionizing a predetermined percentage of the clusters;
directing the ionized clusters to the substrate while directing the nonionized clusters away from the substrate; and
substantially continuously varying the percentage of clusters that are ionized to thereby vary the deposition rate of the second compound.

27. The material of claim 26 wherein the second compound includes oxygen.

28. The material of claim 27 wherein the first compound includes silicon or zinc.

29. The material of claim 28 wherein varying the composition provides a substantially continuously varied index of refraction.

30. The material of claim 29 wherein the index of refraction is a substantially linear gradient across the thickness of the material.

31. The material of claim 25 wherein the first compound includes elements selected from the group consisting of Group II, Group III, Group V, or Group VI elements.

32. The material of claim 25 wherein the material is a binary, ternary, or quarternary semiconductor material containing at least one element from the Group II, Group III, Group V, or Group VI elements.

33. An ion cluster beam film deposition system, comprising:
(a) a deposition chamber including at least one support for a film;
(b) at least one injector for introducing a film material into the chamber;
(c) control means, associated with the injector, for controlling the deposition of the material on the support such that substantially instantaneous and linear variations can be made in the deposition rate of the film material and thereby in the composition of the material in the film.

34. The system of claim 33 wherein the control means includes:
(a) means for ionizing a portion of the film material in the chamber; and
(b) deflector means for deflecting the ionized portion of the film material to the support.

35. The system of claim 34 wherein the control means further includes an electron stripper and voltage regulator means for controlling the voltage to the stripper.

36. The system of claim 35 wherein the stripper includes a wire filament cathode, a shield grid, a screen grid, and a plate anode, and wherein the voltage regulator means is connected to and controls the voltage applied to the screen grid.

37. The system of claim 36 wherein the cathode has a characteristic voltage $V_c$, the anode has a characteristic voltage $V_p$ that is positive with respect to $V_c$, and the screen grid has a selectively variable voltage permitting control of electrons traveling between the anode and cathode.

38. The system of claim 35 further comprising an ion cluster beam accelerator associated with the stripper.

39. An ion cluster beam film deposition system, comprising:
   (a) a deposition chamber including a target area for deposition of a film;
   (b) means for introducing controlled amounts of a cluster beam of clusters of a material to the chamber;
   (c) means for controllably ionizing a predetermined portion of the clusters in the cluster beam to prepare an ion cluster beam;
   (d) means for deflecting the ionized clusters in the ion cluster beam from a first path non-coincident with the target area into a second path coincident with the target area so that the ionized clusters collide with the target area and are incorporated into the film while the nonionized clusters miss the target area.

40. The system of claim 39 wherein the ionizing means includes an electron stripper and wherein the degree of ionization of clusters is proportional to the voltage supplied to the stripper.

41. The system of claim 40 wherein the system further comprises means for substantially instantaneously varying the voltage to the stripper.

42. A method for preparing a controllable atomic oxygen beam having a predetermined energy, comprising the steps of:
   (a) creating a cluster beam of oxygen clusters;
   (b) ionizing a portion of the oxygen clusters in the beam;
   (c) accelerating the ionized clusters to a predetermined energy;
   (d) separating the ionized clusters from the beam.

43. The method of claim 42 further comprising the step of directing the separated ionized clusters to a target.

44. The method of claim 42 wherein the step of separating includes deflecting the ionized clusters from a first path to a second path with an electromagnetic field.

45. The method of claim 42 wherein the step of creating an oxygen cluster beam includes the steps of:
   (a) cooling a reservoir of the oxygen to a predetermined temperature;
   (b) vaporizing a portion of the oxygen at the predetermined temperature;
   (c) expanding the vapor adiabatically through a nozzle into a high vacuum region to form oxygen clusters traveling in a first direction.

46. A controller for an ion cluster beam deposition system, the controller allowing substantially linear control of the deposition of a material on the target area, the controller comprising:
   (a) means for creating a cluster beam of the material at a predetermined rate;
   (b) ionizing means for creating a predetermined and controllable portion of ionized clusters in the beam; and
   (c) means for separating the ionized clusters from the nonionized clusters.

47. The controller of claim 46 wherein the ionizing means includes an electron stripper and a voltage control for substantially instantaneous control of the voltage supplied to the stripper.

* * * * *